United States Patent [19]
Gupta et al.

[11] Patent Number: 5,456,796
[45] Date of Patent: Oct. 10, 1995

[54] CONTROL OF PARTICLE GENERATION WITHIN A REACTION CHAMBER

[75] Inventors: Anand Gupta, San Jose; Yan Ye, Campbell; Joseph Lanucha, Sunnyvale, all of Calif.

[73] Assignee: Applied Materials, Inc., Santa Clara, Calif.

[21] Appl. No.: 71,288

[22] Filed: Jun. 2, 1993

[51] Int. Cl.$^6$ .................................................. H05H 1/00
[52] U.S. Cl. .......................... 156/643.1; 156/345; 134/1; 204/298.34; 204/298.37; 118/723 E; 427/569
[58] Field of Search ..................................... 156/643, 646, 156/345; 204/298.37, 298.34; 134/1; 118/723 E; 427/569, 571

[56] References Cited

U.S. PATENT DOCUMENTS

| | | | |
|---|---|---|---|
| 4,761,219 | 8/1988 | Sasaki et al. | 204/298.37 |
| 4,795,529 | 1/1989 | Kawasaki et al. | 156/643 |
| 4,985,112 | 1/1991 | Egitto et al. | 156/643 |

FOREIGN PATENT DOCUMENTS

| | | | |
|---|---|---|---|
| 0425419 | 9/1990 | European Pat. Off. | C23C 16/50 |
| 0453780 | 10/1991 | European Pat. Off. | H01J 37/32 |
| 4128779 | 8/1991 | Germany | C23F 4/00 |

OTHER PUBLICATIONS

G. Selwyn, *Plasma particulate contamination control. I. Transport and Process Effects*, 29 May 1991. pp. 3487–3492, J. Vac. Sci. Technol. B, vol. 9, No. 6 (Nov./Dec. 1992).

G. Selwyn, E. Patterson, *Plasma particulate contamination control. II. Self–cleaning tool design*, Journal of Vacuum Technology A. (Vacuums, Surfaces, and Films), vol. 10, No. 8, pt. 1, pp. 1053–1059 (Jul. 1992).

*Primary Examiner*—Thi Dang
*Attorney, Agent, or Firm*—Michael A. Glenn; Charles Guenzer

[57] ABSTRACT

An RF signal is rapidly brought to a high power level prior to the introduction of a wafer into the reaction chamber to initiate a plasma that agitates and circulates any particles within the reaction chamber, thereby allowing effective reaction chamber cleaning; and an RF signal is slowly brought to a high power level to initiate a plasma prior to or during wafer processing to avoid disturbing and circulating such particles during wafer processing, thereby preventing particle induced contamination. A magnetic field may be applied to the reaction chamber to move particles from a plasma sheath/glow region interface to a reaction chamber exhaust line, and thereby prevent such particles from falling onto a processed wafer.

14 Claims, 1 Drawing Sheet

CONTROL OF PARTICLE GENERATION WITHIN A REACTION CHAMBER

BACKGROUND OF THE INVENTION

TECHNICAL FIELD

The present invention relates to the control of particle generation during the fabrication of integrated circuits. More particularly, the present invention relates to preventing particle contamination of integrated circuits during plasma processing within a reaction chamber.

DESCRIPTION OF THE PRIOR ART

A plasma is often used during the fabrication of integrated circuits in a reaction chamber to excite individual atoms of chemical reactants within the chamber. A typical reaction chamber 10 (represented schematically in FIG. 1) confines the reactants used during semiconductor wafer 14 processing. The semiconductor wafer 14 is electrically coupled to a cathode 13, and a plasma is initiated within the reaction chamber when an RF signal is generated at a generating source 11 and coupled from the source 11 to an anode 12 and the cathode 13 by a control and coupling circuit 15.

During plasma initiation and subsequent plasma processing, deposits, particles, and other contaminants 16 within the reaction chamber, for example on the reaction chamber walls and base, are randomly agitated and circulated within the reaction chamber. Such particles are readily observed by shining a laser beam into the reaction chamber during plasma processing or by monitoring the reaction chamber exhaust line. See, for example G. Selwyn, *Plasma Particulate Contamination Control I Transport and Process Effects*, J. Vac. Sci. Technol. B, Vol. 9, No. 6 (1991) in which the transport and distribution of particles present in plasma processes are discussed in connection with techniques for observing such phenomena using real-time imaging (and, see also European patent application no. EP-A-0 425 419).

It is essential that the wafer surface is kept as free as possible from particles and other contaminants if acceptable manufacturing results are to be achieved. This is because any resulting wafer contamination seriously impacts device yield per wafer processed, manufacturing throughput, individual device quality, and the per device cost of manufacture. It is therefore desirable to remove all or as many of such contaminants as possible from the reaction chamber prior to wafer processing; to prevent circulation of such particles during wafer processing; and to prevent contamination that occurs when particles trapped in the interface of the plasma sheath and glow region fall onto the wafer when the plasma is extinguished. Some of these particles are pumped out of the reaction chamber through the exhaust system 17, but a significant portion of such particles are either deposited within the reaction chamber, or are trapped in the interface between the plasma glow region and the plasma sheath.

The problem of particle contamination of semiconductor wafers is well recognized in the art and various schemes have been proposed for removing such particles from a reaction chamber. In G. Selwyn, *Plasma Particulate Contamination Control 1. Transport and Process Effects*, J. Vac. Sci. Technol. B, Vol. 9, No. 6 (1991) a strategy is presented for plasma contamination control, including a plasma tool design in which particle traps are identified and eliminated, and in which reduced RF power levels are used in conjunction with increased gas flow rates to push particle trappings toward and into an exhaust pump. Even so, Selwyn concludes that the complete elimination of trapping effects is not feasible. Additionally, the modified RF power levels and gas flow rates proposed by Selwyn are likely to produce unpredictable wafer processing results.

G. Selwyn, E. Patterson, *Plasma Particulate Contamination Control. II. Self Cleaning Tool Design*, Journal of Vacuum Science and Technology A (Vacuums, Surfaces, and Films) Vol. 10. No. 4, Pt. 1, pg. 1053–1059 (1992), discusses topological considerations when designing a plasma tool to reduce or eliminate the possibility of plasma trapping. In particular, a self-cleaning electrode is discussed in which particles are trapped in designated regions away from the wafer and near a pathway to an exhaust pump port. The tool disclosed requires a special manufacture and is therefore likely to be expensive. Such tool is not intended for operation in conventional, installed plasma systems, such that retrofitting to a conventional reaction chamber is also likely to be expensive. Additionally, the tool disclosed only addresses particle trappings in the region above the wafer, and not particle deposits within the chamber itself.

European patent application no. EP-A-0 425 419 discloses various methods of cleaning a reaction chamber, including gettering, microwave induced standing waves, acoustic and physical shocks, and various stresses, such as vibrational, thermal, and pressure stress. The various processes disclosed are concerned with preventing the formation of particle trappings, but do not address the issue of removing deposits that have accumulated within the chamber, nor do they address the removal of trappings within a plasma sheath/glow region interface.

Various schemes for reducing particle contamination are also known in the art, such as lifting particles from a surface to be processed with an inert plasma and drawing such lifted particles away by increasing the flow of said inert gas; reducing pressure and increasing gas flow to sweep particles from the reaction chamber; and reducing particle contamination using electrostatic forces on a processed surface. It would nonetheless be useful to control the generation and circulation of particles in a reaction chamber in a coordinated consistent and predictable manner.

SUMMARY OF THE INVENTION

The present invention teaches the use of selected plasma initiation and maintenance in a reaction chamber as part of a process flow to control the circulation and generation of particles within the chamber. The present invention has application in any plasma tool, such as those that are used in deposition, etching, or in-situ dry clean processes on a chemical vapor deposition ("CVD"), etch, or physical vapor deposition ("PVD") system.

In one preferred embodiment of the invention, a plasma is initiated by coupling an RF signal to electrodes within the reaction chamber. The RF signal is rapidly brought to full power, thus initiating a plasma within the chamber. The sudden and deliberate initiation of the plasma within the chamber, where a plasma is produced in accordance with the selected and rapid rise in RF power, agitates and stirs up particles within the chamber in a controlled fashion. This embodiment of the invention is particularly useful to stir up particles and other contaminants in the reaction chamber, such that the particles may be readily exhausted from the reaction chamber through the reaction chamber exhaust port prior to introduction of a wafer into the reaction chamber. In this way, the reaction chamber may be cleaned by selected use of the plasma. This embodiment of the invention is also useful for evenly distributing particles within the reaction chamber, e.g. for deposition on a wafer surface pursuant to a desired process step.

In preferred embodiment of the invention, a plasma is initiated by application to electrodes within the reaction chamber of an RF signal that is slowly brought to full power. A selected, gradual increase in RF power as taught by this embodiment of the present invention does not agitate particles that may be present within the reaction chamber. Thus, the present invention reduces or eliminates wafer contamination by avoiding stirring up and circulating particles within the reaction chamber, which might otherwise result from the sudden creation of a plasma in response to the introduction of a sudden, uncontrolled high level RF signal.

Another embodiment of the invention mitigates the tendency of some materials to incompletely react or fail to react altogether in the presence of a plasma, where the plasma is initiated with an RF signal having a low or gradually increasing power level. Such RF signal is supplied, for example, in accordance with the present invention to prevent the disturbance of particles within a reaction chamber, and thus minimize contamination of the wafer, as described above. In this embodiment of the invention, the RF signal power level supplied to the reaction chamber during plasma initiation is slowly raised to avoid disturbing particles within the chamber. Reactants are not supplied to the reaction chamber and wafer processing is not commenced during plasma initiation. Rather, the reaction chamber is filled with an inert gas, such as Argon, during the plasma ramp. When the plasma is at full power, reactants are introduced into the reaction chamber, and the wafer is processed as though the plasma had been initiated at full power. In this way, the present invention may be used to avoid the circulation of particles within the reaction chamber during plasma initiation and subsequent wafer processing, or to avoid particle generation or process problems due to incomplete reactions at low power.

Yet another embodiment of the present invention removes particles from within a reaction chamber through the coordinated manipulation of a plasma and an external magnetic field. In this embodiment of the invention, a magnetic field moves charged particles that are trapped in the interface between the plasma sheath and the glow region from such interface region to a reaction chamber exhaust system. The particles are drawn from the interface region after wafer processing is complete to prevent interference with normal wafer processing by the external magnetic field, and while the plasma continues to be generated to prevent particles from falling onto the surface of the processed wafer.

DETAILED DESCRIPTION OF THE INVENTION

The present invention provides controlled particle generation and/or circulation within a reaction chamber as a function of a selected RF signal power level ramp supplied to chamber electrodes during plasma initiation. The present invention also removes particles from within a plasma sheath/glow region interface by application of a magnetic field to the reaction chamber.

Figure 2A:
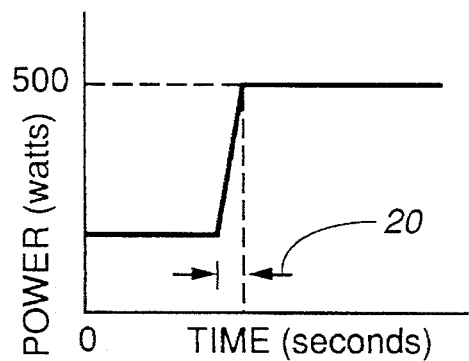
FIGS. 2a and 2b provide two plasma power ramp curves according to a first and a second embodiment of the present invention.
Figure 2B:
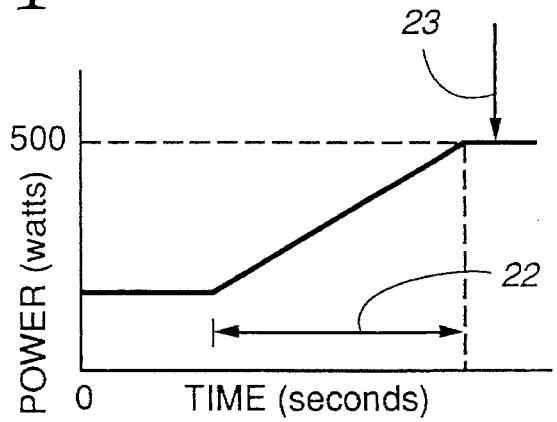

FIGS. 2a and 2b provide a first and a second plasma ramp curve, which respectively illustrate a first and a second embodiment of the present invention.

Figure 1:
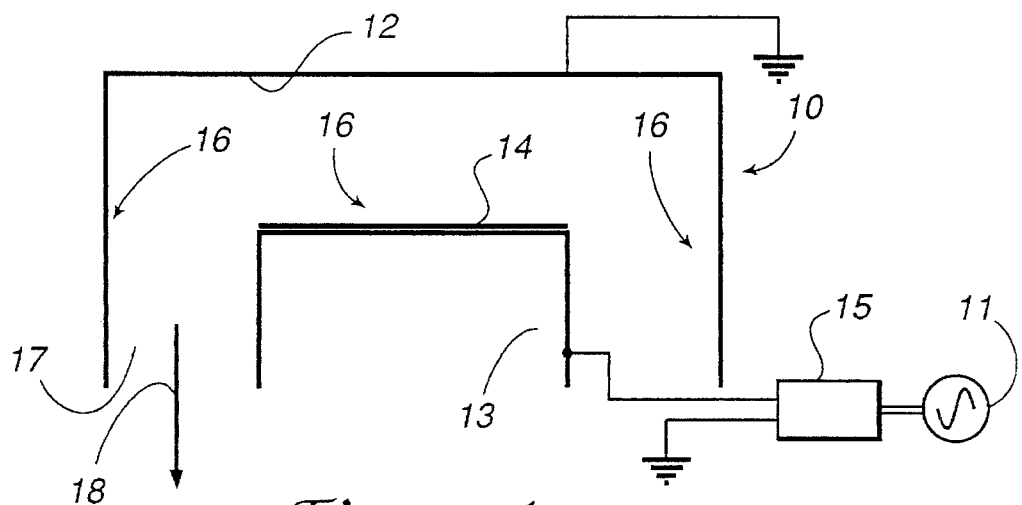
FIG. 1 is a schematic representation of a typical reaction chamber.

In a first embodiment of the invention shown in FIG. 2a, a plasma is initiated when an RF signal having a frequency of 13.56 MHz is generated by and RF signal generator (indicated by numeric designator 11 on FIG. 1), and is coupled between the anode and the cathode of a reaction chamber by a control circuit (indicated by numeric indicator 15 on FIG. 1 ).

In the invention, the RF generator is chosen to operate at an industry standard frequency of 13.56 MHz, although other frequencies may be used. The RF generator may be of any type capable of generating high output power levels of up to 1200 watts or more in a controllable fashion. In the preferred embodiment of the invention, the RF generator ramp rate is a function of the rate at which a drive signal (which may be a drive voltage or a drive current, depending upon the method of operation of the RF generator) is supplied to the RF generator. The drive signal is programmed to a fast ramp (producing an RF generator output at a rate of 500–2000 watts/second) or a slow ramp (producing an RF generator output at a rate of less than 1 watt/second to about 100 watts/second). such drive signal programming may be a software function, or other known method of generating a drive signal at a user selected rate of signal level increase.

The RF signal power level as shown in FIG. 2a is ramped rapidly. In the preferred embodiment of the invention, the RF signal power supplied to the reaction chamber is ramped from 0 watts to 500 watts in one second (see numeric designator 20 in FIG. 2a), i.e. at a rate of 500 watts/second. This ramp is useful in a reaction chamber to agitate and/or circulate particles within the reaction chamber, i.e. both those particles which are deposited on the inner surface of the reaction chamber, and sedimentary particles that may collect on horizontal surfaces within the reaction chamber. Such particles are agitated by the flux associated with a sudden and controlled application of a plasma and, like a fine dust, the particles are readily drawn from the chamber through a reaction chamber exhaust port by the application of negative pressure thereto. If desired, the plasma may be ramped in this fashion more than one time, such that the reaction chamber is repeatedly cleaned, or such that particles within the reaction chamber are continuously maintained in an agitated state, and thereby circulated within the reaction chamber.

It will be appreciated by those skilled in the art that the discussion herein, both above and that following, is intended to illustrate various embodiments of the present invention. Thus, specific details of reaction chamber construction and electrode arrangement therein; actual RF signal generation and control, and plasma frequency/power levels are either considered well known or a matter of choice. Additionally, it should be noted that the actual RF power level achieved at the end of the signal ramp-up is a matter of choice as this embodiment of the invention is primarily concerned with the rate at which RF increase, and not with the ultimate level of RF power.

It is expected that the present invention will find broad application in any process chamber employing a plasma as part of a process step. Thus, the present invention, in addition to chamber cleaning, is used to agitate and/or circulate particles within a reaction chamber in various process steps, such as the even distribution and/or application of coatings, particle deposition, etc.

FIG. 2b illustrates an RF signal power level ramp in which RF signal power supplied to electrodes within the reaction chamber is increased slowly. In the preferred embodiment of the invention, RF power is increased from zero watts to full power (nominally 500 watts) at a rate of about 50 watts/second, one-tenth the ramp rate of that for the embodiment of FIG. 2a (see numeric designator 22 in FIG. 2b). In this way, the plasma within the reaction chamber is initiated slowly, such that particles and other contaminants within the chamber are not agitated or disturbed. Thus, this embodiment of the present invention minimizes the likelihood that particles are circulated within the reaction chamber where they are likely to fall onto and contaminate the surface of a wafer being processed. The actual ramp rate used is a function of various factors, including, for example particle size, processing power necessary to complete a desired reaction, sensitivity of the wafer to contamination (e.g. based on feature size), This embodiment of the invention is useful in any plasma system in any application involving, for example, CVD, PVD, and/or etching and in which any material is to be processed. For example, when etching with commonly known reactants and materials the following reactants/materials may be used, including for purposes of illustration: $BCl_3/Cl_2$ for metal, $HBr/Cl_2$ for silicon, $NF_3/C_2F_6$ for oxides, $CF_4/O_2$ for oxides, Ar for sputtering, etc.

Some processes do not proceed or do not carry forward to conclusion unless a plasma is maintained within the reaction chamber at a high or full power level. Thus, it is preferred when practicing this embodiment of the present invention for these applications to initiate and slowly ramp the plasma power level in the presence of an inert gas, such as Argon. In this way contaminants are not agitated by the plasma ramp and contamination is minimized, as taught above. When the plasma is at its full power level (indicated by numeric designator 23 on FIG. 2b), the flow of inert gas to the reaction chamber may be stopped and the desired reactant gas is introduced into the chamber. For example, when performing silicon dioxide deposition using Tetra-ethyl-ortho-silicate (TEOS) in the presence of oxygen, and under the influence of a plasma, the present invention is practiced as set forth above. That is, the plasma is slowly ramped to its full power level in the presence of an inert gas. Thereafter, oxygen is introduced into the reaction chamber to drive the $TEOS/O_2$ reaction and thereby deposit $SiO_2$ on the surface of a processed wafer.

Thus, the present invention teaches, as can be seen from the RF power ramps shown in FIGS. 2a and 2b, that particle control, and conversely, particle generation, within a reaction chamber are a function of the rate at which RF signal power levels are increased, and of the resulting rate at which a plasma is initiated. This aspect of the present invention provides a method for selecting the level of particle generation within the reaction chamber. By selecting a faster plasma ramp, particles within the chamber (or particles that are introduced into the reaction chamber as part of a process step) are increasingly agitated; and by selecting a slower plasma ramp, particles within the reaction chamber are not circulated within the reaction chamber, thereby reducing the potential for contamination attendant with circulation of such particles. Thus, particle generation and control are deliberately effected as desired.

Figure 3:
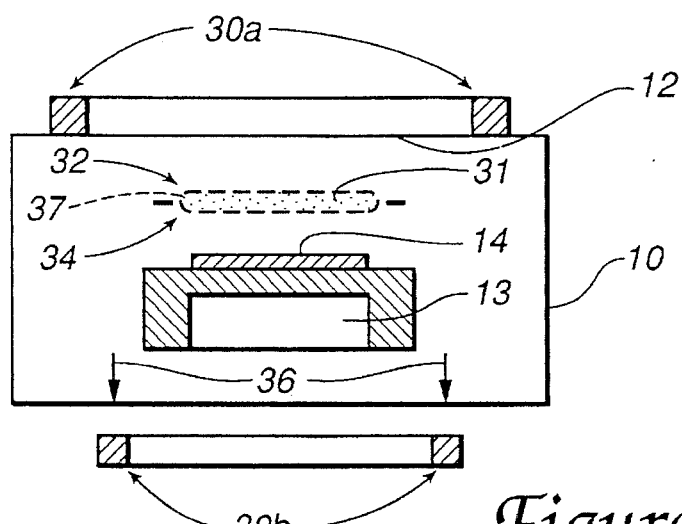
FIG. 3 provides a cross sectional schematic representation of another embodiment of the present invention.

FIG. 3 provides a cross sectional schematic representation of a reaction chamber to which another embodiment of the invention is applied. This embodiment of the present invention is useful for removing particles trapped within the plasma sheath/glow region interface (discussed below) from the reaction chamber. The present invention operates with any reaction chamber, for example of the type that is described above in connection with FIG. 1.

A plasma of the type generated in an reaction chamber includes a portion referred to as a glow region 32, and a plasma sheath 34. The point where the glow region and the plasma sheath intersect is referred to the as the interface 37. Particles 31 in circulation within the reaction chamber are trapped in this plasma/sheath interface region. When the plasma is extinguished upon completion of wafer processing, such particles drop onto and contaminate the wafer. It is believed that such particle trapping results in part due to perturbation of the plasma sheath resulting from topological variations in the cathode, e.g. due to the elevation of the wafer above the surface of the cathode, the presence of a wafer clamp ring, etc. See, for example G. Selwyn, *Plasma Particulate Contamination Control I. Transport and Process Effects*, J. Vac. Sci. Technol. B, Vol. 9, No. 6 (1991).

The present invention provides magnets 30a/30b which are arranged on the outside and proximate to the reaction chamber. The magnets generate a magnetic field that is believed to accelerate the trapped particles and thus draw the particles away from the critical zone consisting of the glow region/plasma sheath interface. It is believed that such particles respond to the magnetic field due to their negative charge.

The magnets may be permanent magnets or electromagnets. If permanent magnets are used then the magnets should preferably have a field strength of about 100 Gauss or more. If electromagnets are used, the magnets may be AC or DC electromagnets. If the magnets are electromagnets, the magnets are not operated during actual wafer processing.

In all cases, the magnets are arranged relative to the wafer such that the flux lines of the magnetic field generated by the magnets are perpendicular to the wafer surface. Thus, the force and velocity components of the magnetic field are oriented to add velocity to the particles in the interface region (in addition to lateral force that may be supplied by a gas flow within the chamber) and thereby move the particles out of the interface region and toward the chamber exhaust ports. The magnetic poles may be alternated to move the particles away from the interface region in two or more directions, such that the particles are routed to multiple chamber exhaust ports. The actual positioning of the magnets is a function of wafer placement and exhaust port locations, as well as electrode structure within the chamber. The magnets themselves are not placed within the chamber.

If electromagnets are used to practice the invention, then the electromagnets are energized upon completion of wafer processing, but before the plasma is extinguished. The electromagnets may be fabricated in accordance with known practices and as suitable for the particular reaction chamber used. Operation of the electromagnets may be accomplished by controlled application of electrical energy, as is well known in the art.

Upon completion of wafer processing, the reactants used during processing are removed from the reaction chamber to prevent such processing from continuing past the selected endpoint. The reaction chamber may then be filled with an inert gas, such as Argon or Helium. During this time the plasma is maintained. If electromagnets are used, then the electromagnets are energized at this point. The particles are drawn from the critical zone by the magnets (in combination with a lateral gas flow within the chamber, if supplied), as discussed above. Once the particles are positioned away from the critical zone by magnetic attraction the plasma may be extinguished. The particles drop under the influence of gravity (and through application of various gas flow within the chamber, if desired), preferably into an exhaust port 36, where they are removed from the reaction chamber. If permanent magnets are used, particles are continuously purged away from the interface region during wafer processing.

The various embodiments of the present invention may be used separately or in any desired combination as part of a process flow. Thus, it is possible to first clean a chamber by applying an RF signal having a rapidly increasing power level to the reaction chamber prior to the introduction of a wafer within the chamber. This step is performed such that particles within the reaction chamber, which are brought into circulation by the resulting plasma, are drawn from the chamber prior to wafer processing.

The invention may then be used to avoid the deleterious effects associated with the introduction and circulation of residual particles within the reaction chamber. This step is performed during wafer processing while the wafer is in place within the chamber by providing a gradual and selected increase of RF signal power levels supplied to the reaction chamber at initiation of the plasma.

Thereafter, when wafer processing is complete, such particles as are trapped in the plasma sheath/glow region interface may be drawn away from the interface region with an electromagnetically induced field. This step is performed such that the particles are moved away from the wafer surface and brought to the reaction chamber exhaust port, where the particles are removed from the reaction chamber.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

We claim:

1. A method for agitating and/or circulating particles present within a reaction chamber, comprising the steps of:

increasing the power level of an RF signal supplied to electrodes within the reaction chamber at a first rate of about 500 to 2000 watts/second to initiate a first plasma therein, wherein said RF signal power level is rapidly increased;

exhausting said particles from within said reaction chamber; and positioning a semiconductor wafer within said reaction chamber for wafer processing;

increasing the power level of an RF signal supplied to electrodes within the reaction chamber at a second rate from about less than 1 watt/second to 100 watts/second to initiate a second plasma therein, wherein said RF signal power level is slowly increased, and wherein said second plasma does not agitate and/or circulate said particles.

2. The method of claim 1, wherein said RF signal power level is rapidly increased at a first rate of about 500 watts/second.

3. The method of claim 1, wherein said RF signal power level is slowly increased at a second rate of about 50 watts/second.

4. A method for removing contaminating particles trapped in a plasma sheath/glow region interface within a reaction chamber, comprising the steps of:

removing any reactants used during processing from the reaction chamber;

maintaining said plasma within the reaction chamber;

filling the reaction chamber with an inert gas;

applying a magnetic field to said reaction chamber, such that the force and velocity components of said magnetic field are oriented to move said particles away from said plasma sheath/interface; and exhausting said particles from said reaction chamber.

5. A method for preventing contamination of a semiconductor wafer during integrated circuit fabrication within a reaction chamber, comprising the steps of:

increasing the power level of an RF signal supplied to electrodes within the reaction chamber at a first selected rate, prior to introduction of said semiconductor wafer into said reaction chamber for processing, to initiate a first plasma therein, said first plasma effecting controlled agitation and/or circulation of said particles within said reaction chamber;

exhausting said particles from within said reaction chamber to effect chamber cleaning;

extinguishing said first plasma;

positioning said semiconductor wafer within said reaction chamber for wafer processing;

increasing the power level of an RF signal supplied to electrodes within the reaction chamber at a second selected rate to initiate a second plasma therein; wherein said second plasma does not agitate and/or circulate said particles.

6. The method of claim 5, wherein said RF signal power level for said first plasma is increased at a rate of about 500 watts/second.

7. The method of claim 5, wherein said RF signal power level for said second plasma is increased at a rate of about 50 watts/second.

8. The method of claim 5, further comprising the steps of:

applying a magnetic field proximate to said reaction chamber;

removing residual particles from a second plasma sheath/glow region interface in response to said magnetic field; and exhausting said residual particles from said reaction chamber.

9. A method for initiating a plasma within a reaction chamber without agitating and/or circulating particles present therein, comprising the steps of:

positioning a semiconductor wafer within said reaction chamber for wafer processing;

introducing an inert gas into said reaction chamber;

slowly increasing the power level of an RF signal supplied to electrodes within the reaction chamber at a rate of about less than 1 watt/second to 100 watts/second to initiate a plasma therein having a shallow ramp; and introducing a reactant into said reaction chamber after said plasma is at full power.

10. The method of claim 9, wherein said RF signal power level is increased at a rate of about 50 watts/second.

11. The method of claim 9, further comprising the steps of:

applying a magnetic field proximate to said reaction chamber;

removing residual particles from a plasma sheath/glow region interface in response to said magnetic field; and exhausting said residual particles from said reaction chamber.

12. A method for preventing contamination of a semiconductor wafer during integrated circuit fabrication within a reaction chamber, comprising the steps of:

rapidly increasing the power level of an RF signal supplied to electrodes within the reaction chamber at a rate of about 500 to 2000 watts/second, prior to introduction of said semiconductor wafer into said reaction chamber for processing, to initiate a first plasma therein having a steep ramp; said plasma effecting controlled agitation and/or circulation of said particles within said reaction chamber;

exhausting said particles from within said reaction chamber to effect chamber cleaning;

extinguishing said first plasma;

positioning said semiconductor wafer within said reaction chamber for wafer processing;

slowly increasing the power level of an RF signal supplied to electrodes within the reaction chamber at a rate from less than 1 watt/second to 100 watts/second to initiate a second plasma therein having a shallow ramp; wherein said second plasma does not agitate and/or circulate said particles;

applying a magnetic field generated by a magnet placed proximate to said reaction chamber;

removing residual particles from a second plasma sheath/glow region interface in response to said magnetic field; and exhausting said residual particles from said reaction chamber.

13. An apparatus for preventing contamination of a semiconductor wafer during integrated circuit fabrication within a reaction chamber, comprising:

a control circuit that generates a drive signal;

an RF generator that provides an output RF signal having a ramp rate that is a function of the ramp rate of said drive signal;

wherein said drive signal increases the power level of the RF signal supplied by said RF generator to electrodes within the reaction chamber at a first rate of about 500 to 2000 watts/second, prior to introduction of said semiconductor wafer into said reaction chamber for processing, to initiate a first plasma therein, said first plasma effecting controlled agitation and/or circulation of said particles within said reaction chamber; and at a second rate of about less than 1 watt/second to 100 watts/second, after introduction of said semiconductor wafer into said reaction chamber for processing, to initiate a second plasma therein, wherein said second plasma does not agitate and/or circulate said particles; and an exhaust adapted to remove said particles from within said reaction chamber to effect chamber cleaning prior to introduction of said semiconductor wafer into said reaction chamber for processing.

14. The apparatus of claim 13, further comprising:

a magnet for producing a magnetic field proximate to said reaction chamber to remove residual particles from a second plasma sheath/glow region interface in response to said magnetic field.

* * * * *